(12) United States Patent
Inadomi et al.

(10) Patent No.: US 10,593,571 B2
(45) Date of Patent: Mar. 17, 2020

(54) SUBSTRATE PROCESSING APPARATUS

(71) Applicant: Tokyo Electron Limited, Tokyo (JP)

(72) Inventors: Hiroaki Inadomi, Kumamoto (JP); Tooru Nakamura, Kumamoto (JP); Kouji Kimoto, Kumamoto (JP); Yasuo Kiyohara, Kumamoto (JP); Satoshi Okamura, Kumamoto (JP); Satoshi Biwa, Kumamoto (JP); Nobuya Yamamoto, Kumamoto (JP); Katsuhiro Ookawa, Kumamoto (JP); Keiichi Yahata, Kumamoto (JP); Tetsuro Nakahara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/467,001

(22) Filed: Mar. 23, 2017

(65) Prior Publication Data

US 2017/0287742 A1 Oct. 5, 2017

(30) Foreign Application Priority Data

Mar. 31, 2016 (JP) .................................. 2016-070517

(51) Int. Cl.
*H01L 21/67* (2006.01)
*B08B 3/02* (2006.01)
(Continued)

(52) U.S. Cl.
CPC ........ *H01L 21/67051* (2013.01); *B08B 3/024* (2013.01); *B08B 3/08* (2013.01); *B08B 3/10* (2013.01)

(58) Field of Classification Search
CPC ............. H01L 21/67051; H01L 21/677; H01L 21/67703; H01L 21/67739; H01L 21/67745; H01L 21/67161
See application file for complete search history.

(56) References Cited

U.S. PATENT DOCUMENTS

| | | | |
|---|---|---|---|
| 6,245,156 B1 * | 6/2001 | Taniyama | H01L 21/67276 134/6 |
| 6,703,316 B2 * | 3/2004 | Inoue | H01L 21/02052 156/345.31 |

(Continued)

FOREIGN PATENT DOCUMENTS

| | | |
|---|---|---|
| JP | 2002-329650 A | 11/2002 |
| JP | 2003-100691 A | 4/2003 |
| JP | 2013-254904 A | 12/2013 |

*Primary Examiner* — Marc Lorenzi
(74) *Attorney, Agent, or Firm* — Abelman, Frayne & Schwab (57) ABSTRACT

Provided is a substrate processing apparatus including a liquid processing unit that performs a liquid processing on a substrate; a drying processing unit that performs a drying processing on the substrate in a wet state; a first conveyance unit that conveys the substrate to the liquid processing unit; a second conveyance unit that conveys the substrate in the wet state from the liquid processing unit to the drying processing unit; and a third conveyance unit that conveys the substrate before the liquid processing in the liquid processing unit and to convey the substrate after the drying processing from the drying processing unit. The first and second conveyance units and the drying processing unit are disposed on a side that faces the third conveyance unit, and the liquid processing unit is disposed on a side that faces the first and second conveyance units and is opposite to the third conveyance unit.

4 Claims, 6 Drawing Sheets

(51) Int. Cl.
  *B08B 3/08* (2006.01)
  *B08B 3/10* (2006.01)

(56) References Cited

U.S. PATENT DOCUMENTS

| | | | |
|---|---|---|---|
| 2006/0033678 A1* | 2/2006 | Lubomirsky | C23C 16/06 345/32 |
| 2012/0016516 A1* | 1/2012 | Machida | H01L 21/67178 700/218 |
| 2013/0327363 A1* | 12/2013 | Inadomi | H01L 21/67034 134/26 |
| 2015/0155188 A1* | 6/2015 | Jung | H01L 21/67034 216/59 |
| 2017/0018442 A1* | 1/2017 | Oh | H01L 21/67051 |
| 2017/0066101 A1* | 3/2017 | Yamaguchi | B24B 37/00 |
| 2017/0098555 A1* | 4/2017 | Gouk | B08B 7/0021 |
| 2017/0250094 A1* | 8/2017 | Verhaverbeke | H01L 21/67034 |

\* cited by examiner

FIG.12

SUBSTRATE PROCESSING APPARATUS

CROSS-REFERENCE TO RELATED APPLICATIONS

This application is based on and claims priority from Japanese Patent Application No. 2016-070517 filed on Mar. 31, 2016 with the Japan Patent Office, the disclosure of which is incorporated herein in its entirety by reference.

TECHNICAL FIELD

The present disclosure relates to a substrate processing apparatus. More particularly, the present disclosure relates to a substrate processing apparatus, which performs a liquid processing on a substrate with a processing liquid using a liquid processing unit, and then performs a drying processing on the substrate with a supercritical fluid using a supercritical drying processing unit.

BACKGROUND

Conventionally, in manufacturing, for example, a semiconductor element or a flat panel display, a liquid processing (e.g., cleaning or etching) is performed on a substrate (e.g., a semiconductor wafer or a liquid crystal substrate) with various processing liquids using a substrate processing apparatus, and then, a drying processing is performed to remove the processing liquid remaining on the substrate.

In the substrate processing apparatus, the substrate is subjected to the liquid processing with the processing liquid using a liquid processing unit, and then, the substrate is subjected to a drying processing using a supercritical drying processing unit by replacing the processing liquid remaining on the substrate with a fluid in a supercritical state (i.e., a supercritical fluid) and vaporizing the supercritical fluid.

In the substrate processing apparatus that performs the supercritical drying processing, a substrate conveyance unit is provided to carry the substrate into the liquid processing unit and to carry the substrate out from the supercritical drying processing unit.

The conventional substrate processing apparatus performs the carry-in of the substrate to the liquid processing unit and the carry-out of the substrate from the supercritical drying processing unit using the same substrate conveyance unit. See, for example, Japanese Patent Laid-Open Publication No. 2002-329650.

SUMMARY

The present disclosure provides a substrate processing apparatus including a liquid processing unit configured to perform a liquid processing on a substrate using a processing liquid; a drying processing unit configured to perform a drying processing on the substrate in a wet state after the liquid processing in the liquid processing unit; a first conveyance unit configured to convey the substrate before the liquid processing to the liquid processing unit; a second conveyance unit configured to convey the substrate in the wet state from the liquid processing unit to the drying processing unit; and a third conveyance unit configured to convey the substrate before the liquid processing in the liquid processing unit and to convey the substrate after the drying processing from the drying processing unit. The first conveyance unit, the second conveyance unit, and the drying processing unit are disposed on a side that faces the third conveyance unit, and the liquid processing unit is disposed on a side that faces the first conveyance unit and the second conveyance unit and is opposite to the third conveyance unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional substrate processing apparatus, when the substrate is carried into the liquid processing unit by the substrate conveyance unit, the processing liquid, scattered or volatilized in the liquid processing unit may be transferred to the substrate conveyance unit.

Once the processing liquid has been transferred to the substrate conveyance unit in the liquid processing unit, the processing liquid may be then transferred from the substrate conveyance unit to the substrate after the processing (after the liquid processing and the drying processing) when the substrate is carried out from the supercritical drying processing unit by the same substrate conveyance unit. Thus, the surface of the substrate after the processing may be contaminated.

Accordingly, the present disclosure provides a substrate processing apparatus including a liquid processing unit configured to perform a liquid processing on a substrate using a processing liquid; a drying processing unit configured to perform a drying processing on the substrate in a wet state after the liquid processing in the liquid processing unit; a first conveyance unit configured to convey the substrate before the liquid processing to the liquid processing unit; a second conveyance unit configured to convey the substrate in the wet state from the liquid processing unit to the drying processing unit; and a third conveyance unit configured to convey the substrate before the liquid processing in the liquid processing unit and to convey the substrate after the drying processing from the drying processing unit. The first conveyance unit, the second conveyance unit, and the drying processing unit are disposed on a side that faces the third conveyance unit, and the liquid processing unit is disposed on a side that faces the first conveyance unit and the second conveyance unit and is opposite to the third conveyance unit.

In the above-described substrate processing apparatus, a plurality of liquid processing units or drying processing units is provided with respect to one first conveyance unit and one second conveyance unit, and the plurality of liquid processing units or the drying processing units share the first conveyance unit and the second conveyance unit.

In the above-described substrate processing apparatus, the third conveyance unit performs conveyance of the substrate to and from a carrier that accommodates a plurality of substrates therein.

In the above-described substrate processing apparatus, a substrate placing unit is disposed on a side that faces the first conveyance unit, the second conveyance unit, and the third conveyance unit to place thereon the substrate in a dry state before the liquid processing in the liquid processing unit.

In the above-described substrate processing apparatus, the drying processing unit is movable to a processing position at which a cover and the substrate placing table are accommodated inside a container body and to a standby position at which the cover and the substrate placing table are retreated to an outside of the container body, and the substrate is carried to the standby position of the cover and the substrate placing table of the drying processing unit by the second conveyance unit, and is carried out from the standby position of the cover and the substrate placing table of the drying processing unit by the third conveyance unit.

In the above-described substrate processing apparatus, the drying processing unit performs a drying processing on the substrate in the wet state using a supercritical fluid.

In the present disclosure, it is possible to prevent a processing liquid from being transferred to a substrate after a drying processing.

Hereinafter, a detailed configuration of a substrate processing apparatus according to the present disclosure will be described with reference to the accompanying drawings.

EXAMPLE 1

Figure 1:
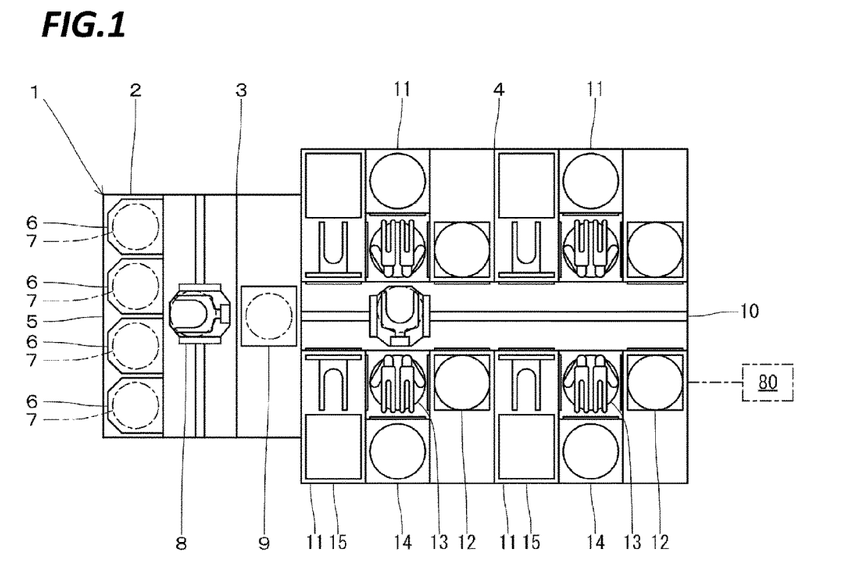
FIG. 1 is a plan explanatory view illustrating a substrate processing apparatus.
Figure 2:
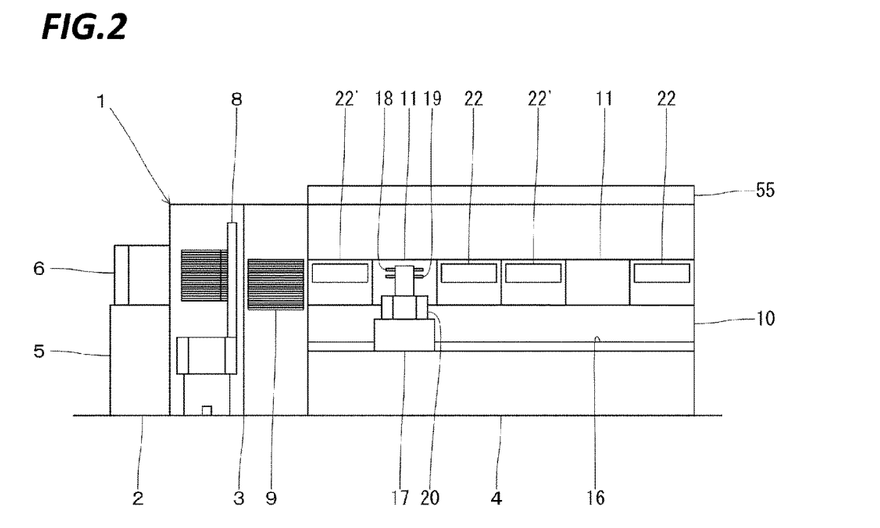
FIG. 2 is a cross-sectional side explanatory view of the substrate processing apparatus.

As illustrated in FIGS. 1 and 2, the substrate processing apparatus 1 includes a carry-in/out section 2 on the front end thereof, a conveyance section 3 at the rear of the carry-in/out section 2, and a processing section 4 at the rear of the conveyance section 3. In addition, the substrate processing apparatus 1 includes a controller 80 that performs a control of the entire substrate processing apparatus 1.

The controller 80 is, for example, a computer, and includes an operation control unit and a storage unit. The operation control unit is configured as, for example, a central processing unit (CPU), and controls an operation of the substrate processing apparatus 1 by reading and executing a program stored in the storage unit. The storage unit is configured as, for example, a storage device (e.g., a random access memory (RAM), a read only memory (ROM), or a hard disc), and stores a program that controls various processings executed in the substrate processing apparatus 1. In addition, the program may be recorded in a computer readable storage medium, or may be installed from the storage medium to the storage unit. The computer readable storage medium may be, for example, a hard disc (HD), a flexible disc (FD), a compact disc (CD), a magneto-optical disc (MO), or a memory card. The recording medium stores, for example, a program that, when executed by a computer for controlling the operation of the substrate processing apparatus 1, causes the computer to control the operation of the substrate processing apparatus 1 to execute a substrate processing method.

In the carry-in/out section 2, a plurality of (here, four (4)) carriers 6 may be horizontally disposed side by side in the upper portion of a substrate carry-in/out table 5. In each carrier 6, a plurality of (e.g., twenty five (25)) substrates 7 (here, semiconductor wafers) before or after a processing is accommodated.

In the conveyance section 3, a substrate conveying device 8 is disposed on the front side and a substrate delivery table 9 is disposed on the rear side. The substrate conveying device 8 is movable in the front-and-rear direction and the left-and-right direction and in the rotation direction, and conveys the plurality of substrates 7 between the carriers 6 and the substrate delivery table 9.

In the processing section 4, a substrate carry-in/out unit 10 (a third conveyance unit) is disposed on the center portion so as to extend in the front-and-rear direction, and substrate processing units 11 are disposed side by side in the front-and-rear direction on the left and right sides of the substrate carry-in/out unit 10. Here, each substrate processing unit 11 includes a substrate placing unit 12, a substrate conveyance unit 13, a liquid processing unit 14, and a supercritical drying processing unit 15 (a drying processing unit).

In the substrate carry-in/out unit 10, substrate holders 18 and 19 for horizontally holding one substrate 7 are attached to a conveyance table 17 to be rotatably, horizontally, and vertically movable along a rail 16 that extends in the front-and-rear direction, via a movable body 20. Here, one substrate holder 18 is used when the substrate 7 before a processing is carried from the substrate delivery table 9 into the substrate processing unit 11 (the substrate placing unit 12), and the other substrate holder 19 is used when the substrate 7 after a processing is carried out from the substrate processing unit 11 (the supercritical drying processing unit 15) to the substrate delivery table 9. Therefore, the transfer of, for example, dust to the substrate 7 is prevented during the carry-in/out of the substrate 7. Here, although the substrate carry-in substrate holder 18 and the substrate carry-out substrate holder 19 are provided on the same moving mechanism (including the rail 16, the conveyance table 17, and the movable body 20), the substrate carry-in substrate holder 18 and the substrate carry-out substrate holder 19 may be provided on separate movement mechanisms so as to be clearly divided into a substrate carry-in unit and a substrate carry-out unit.

Figure 3:
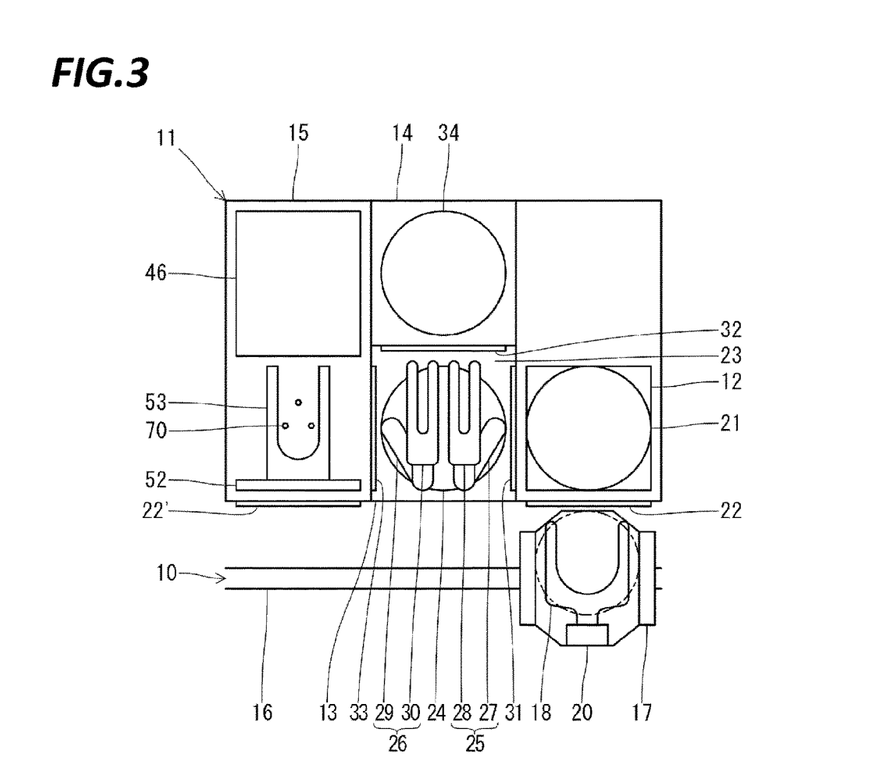
FIG. 3 is an enlarged explanatory view illustrating a substrate processing unit.

In the substrate processing unit 11, as illustrated in FIG. 3, the substrate placing unit 12 and the supercritical drying processing unit 15 are disposed on the side that faces the substrate carry-in/out unit 10. Therefore, the substrate 7 may be carried from the substrate carry-in/out unit 10 to the substrate placing unit 12, and the substrate 7 may be carried out from the supercritical drying processing unit 15 to the substrate carry-in/out unit 10. In addition, in the substrate processing unit 11, the substrate conveyance unit 13 is disposed between the substrate placing unit 12 and the supercritical drying processing unit 15, and the liquid processing unit 14 is disposed on the side that is opposite to the substrate conveyance unit 13 (on the outer side of the substrate processing apparatus 1), such that the substrate placing unit 12, the liquid processing unit 14, and the supercritical drying processing unit 15 are disposed around the substrate conveyance unit 13. Thus, the conveyance time or the conveyance distance when the substrate 7 is conveyed from the substrate placing unit 12 to the liquid processing unit 14 and from the liquid processing unit 14 to the supercritical drying processing unit 15 by the substrate conveyance unit 13 may be reduced, which may result in a reduced processing time (increased throughput) in the substrate processing apparatus 1 or a reduced size (a reduced footprint (occupation area)) of the substrate processing apparatus 1.

The substrate placing unit 12 includes a placing table 21 configured to place the substrate 7 thereon, and forms a carry-in port 22 between the placing table 21 and the substrate carry-in/out unit 10. The substrate 7 is disposed from the carry-in port 22 to the top of the placing table 21 by the substrate carry-in substrate holder 18 of the substrate carry-in/out unit 10. In addition, here, although one placing table 21 is provided in the substrate placing unit 12, a plurality of placing tables 21 may be vertically disposed side by side in the substrate placing unit 12 so as to stock up the plurality of substrates 7. In addition, when the substrate placing units 12 provided in the adjacent substrate processing units 11 are vertically disposed side by side (the placement in a plan view may be the same as in FIG. 7), the size of the substrate processing apparatus 1 may be reduced.

In the substrate conveyance unit 13, a base 24 is provided inside a sealable substrate conveyance chamber 23, and a dry substrate conveyance unit 25 (a first conveyance unit) and a wet substrate conveyance unit 26 (a second conveyance unit) are formed on the top of the base 24. In the dry substrate conveyance unit 25, a substrate holder 28 is attached to a multi-axis arm 27, which is attached to the top of the base 24. Thus, the dry substrate conveyance unit 25 receives the substrate 7, which is in a dry state, from the substrate placing unit 12 using the substrate holder 28, and delivers the substrate 7 to the liquid processing unit 14. In addition, in the wet substrate conveyance unit 26, a substrate holder 30 is attached to a multi-axis arm 29, which is attached to the top of the base 24. Thus, the wet substrate conveyance unit 26 receives the substrate 7, which is in a wet state, from the liquid processing unit 14 using the substrate holder 30, and delivers the substrate 7 to the supercritical drying processing unit 15. In addition, here, although the substrate holders 28 and 30 are attached respectively to the two multi-axis arms 27 and 29 so as to clearly separate the dry substrate conveyance unit 25 and the wet substrate conveyance unit 26 from each other, the two substrate holders 28 and 30 may be attached to one movement mechanism (e.g., a multi-axis arm) so that one movement mechanism serves as both the dry substrate conveyance unit 25 and the wet substrate conveyance unit 26.

The substrate conveyance unit 13 is separated from the substrate carry-in/out unit 10, the substrate placing unit 12, the liquid processing unit 14, or the supercritical drying processing unit 15 by the substrate conveyance chamber 23, and is formed with openings 31, 32 and 33, which may be opened or closed, between the substrate placing unit 12, the liquid processing unit 14, and the supercritical drying processing unit 15.

Figure 4:
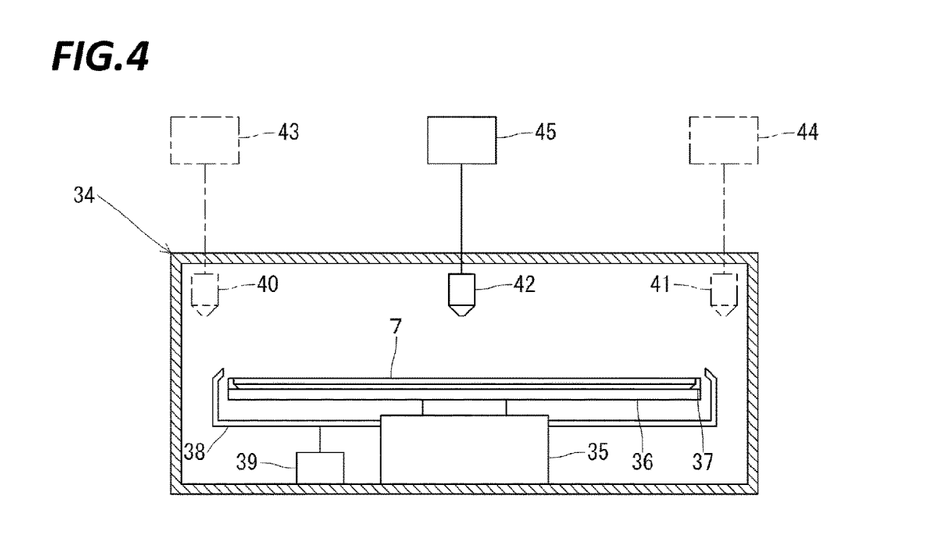
FIG. 4 is a cross-sectional explanatory view illustrating a liquid processing unit.

The liquid processing unit 14 includes a liquid processing device 34 configured to perform a liquid processing on the substrate 7 with a processing liquid. In the liquid processing device 34, as illustrated in FIG. 4, a turntable 36 is attached to a rotating mechanism 35, and holders 37 are attached to the peripheral edge of the turntable 36 so as to be spaced apart from one another in the circumferential direction. As such, the liquid processing device 34 rotates the substrate 7, which is horizontally held by the holders 37, by the rotating mechanism 35. In addition, in the liquid processing device 34, a cup 38 is disposed outside the outer circumference of the turntable 36 (the substrate 7), and an elevating mechanism 39 is connected to the cup 38. Therefore, the liquid processing device 34 moves down the cup 38 upon the carry-in/out of the substrate 7 and moves up the cup 38 upon the liquid processing of the substrate 7 so as to collect the processing liquid. In addition, in the liquid processing device 34, a cleaning processing nozzle 40, a rinse processing nozzle 41, and an anti-drying processing nozzle 42 are independently movably disposed above the turntable 36 (the substrate 7). The cleaning processing nozzle 40 is connected to a cleaning liquid supply mechanism 43, which supplies a cleaning liquid, such as, for example, an aqueous hydrogen fluoride solution. The rinse processing nozzle 41 is connected to a rinse liquid supply mechanism 44, which supplies a rinse liquid, such as, for example, pure water. The anti-drying processing nozzle 42 is connected to an anti-drying liquid supply mechanism 45, which supplies a liquid (an organic solvent, such as, for example, isopropyl alcohol, hydrofluoroether, or acetone) that coats the surface of the substrate 7 after a liquid processing in order to prevent drying thereof.

Figure 5:
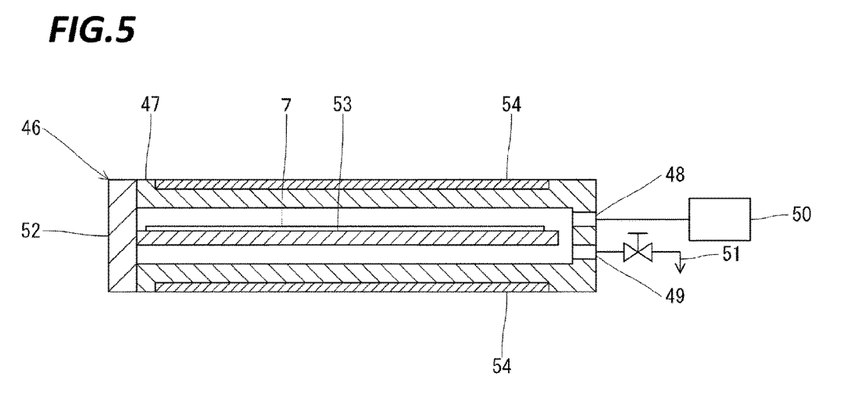
FIG. 5 is a cross-sectional explanatory view illustrating a supercritical drying processing unit.

The supercritical drying processing unit 15 includes a supercritical drying processing device 46 configured to perform a drying processing on the substrate 7 with a supercritical fluid, and forms a carry-out port 22' between the supercritical drying processing device 46 and the substrate carry-in/out unit 10. The substrate 7 is carried out from the carry-out port 22' by the substrate carry-out substrate holder 19 of the substrate carry-in/out unit 10. In the supercritical drying processing device 46, as illustrated in FIG. 5, a suction port 48 and a discharge port 49 are formed in the rear end of a container body 47, which has a rectangular box shape having an open front end, a processing fluid supply mechanism 50, which supplies a fluid in the supercritical state, such as, for example, carbon dioxide, is connected to the suction port 48, and a discharge mechanism 51, which includes, for example, an opening/closing valve, is connected to the discharge port 49. In addition, in the supercritical drying processing device 46, a cover 52 and a substrate placing table 53 are attached to the front end of the container body 47 so as to be opened or closed. The cover 52 and the substrate placing table 53 are movable back and forth between a processing position at which they are accommodated inside the container body 47 and a standby position at which they are retreated to the outside of the container body 47, and operate as a carry-in/out mechanism for the carry-in/out of the substrate 7. In addition, at the standby position at which the cover 52 and the substrate placing table 53 are located outside the container body 47, for example, three substrate support pins 70 are provided so as to be vertically movable by penetrating the substrate placing table 53. The substrate supporting pins 70 perform the delivery of the substrate 7 between the substrate placing table 53, the substrate conveyance unit 13, and the substrate carry-in/out unit 10. More specifically, the substrate 7 is carried into the substrate support pins 70 by the substrate conveyance unit 13, and the substrate support pins 70 are moved down to deliver the substrate 7 to the substrate placing table 53. In addition, after a drying processing is performed, the substrate support pins 70 are moved up to receive the substrate 7 from the substrate placing table 53, and the substrate 7 on the substrate support pins 70 is carried out by the substrate carry-in/out unit 10. In addition, in the supercritical drying processing device 46, heaters 54 are attached to the upper surface and the lower surface of the container body 47 to heat the inside of the container body 47. The supercritical drying processing device 46 may be disposed on the outer side of the substrate processing apparatus 1 (the side that is opposite to the substrate carry-in/out unit 10), in order to increase maintenance workability such as, for example, the replacement of a high pressure-resistant packing between the container body 47 and the cover 52.

In the processing unit 4, for example, a blowing mechanism 55 is provided for each area to blow clean air from the top side to the bottom side into the substrate carry-in/out unit 10 or the substrate processing unit 11. In addition, in the substrate conveyance chamber 23 or the supercritical drying processing unit 15 of the substrate processing unit 11, a nitrogen gas, which substitutes for the clean air, is supplied when the substrate 7 is conveyed in a wet state, so as to create a lower oxygen and lower humid state inside the substrate conveyance chamber 23 than the outside. Therefore, the oxidation of the surface of the substrate 7 before a liquid processing or the volatilization of an anti-drying liquid, which covers the surface of the substrate 7 after a liquid processing, in the liquid processing unit 14 is suppressed. In addition, in the substrate conveyance chamber 23 or the supercritical drying processing unit 15 of the substrate processing unit 11, the nitrogen gas, which substitutes for the clean air, may be supplied when the substrate 7 in a wet state is conveyed. In addition, the nitrogen gas may always be supplied to the substrate conveyance chamber 23 or the supercritical drying processing unit 15.

The substrate processing apparatus 1 is configured as described above, and in the processing section 4, the dry substrate conveyance unit 25 (the first conveyance unit), the wet substrate conveyance unit 26 (the second conveyance unit), and the supercritical drying processing unit 15 (the drying processing unit) are disposed on the side that faces the substrate carry-in/out unit 10 (the third conveyance unit), and the liquid processing unit 14 is disposed on the side that faces the dry substrate conveyance unit 25 (the first conveyance unit) and the wet substrate conveyance unit 26 (the second conveyance unit) and is opposite to the substrate carry-in/out unit 10 (the third conveyance unit). In addition, in the substrate processing apparatus 1, the substrate placing unit 12 for placing the substrate 7, which is in a dry state before a liquid processing in the liquid processing unit 14, is disposed on the side of the processing unit 4 that faces the substrate carry-in/out unit 10 (the third conveyance unit), the dry substrate conveyance unit 25 (the first conveyance unit), and the wet substrate conveyance unit 26 (the second conveyance unit).

In addition, an operation of the substrate processing apparatus 1 is controlled by the controller 80. In the substrate processing apparatus 1, the substrate 7 before a processing is carried into the carry-in/out unit 2 in a state of being accommodated in the carrier 6, a plurality of substrates 7 is conveyed from any one carrier 6 to the substrate delivery table 9 using the substrate conveying device 8 of the conveyance section 3, and the substrates 7 are processed one by one in the processing section 4. The substrates 7 processed in the processing section 4 are conveyed from the substrate delivery table 9 to any one carrier 6 using the substrate conveying device 8 of the conveyance section 3.

Figure 6A:
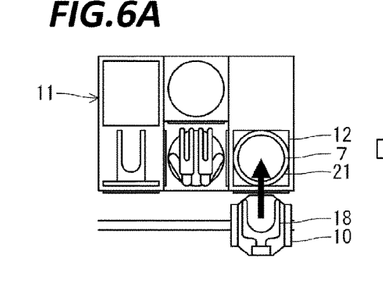
FIGS. 6A to 6D are explanatory views illustrating a substrate processing method in the substrate processing unit.

In the processing section 4, as illustrated in FIG. 6A, the substrate 7, which is in a dry state before a liquid processing, is carried one by one from the substrate delivery table 9 to the substrate placing unit 12 of any one substrate processing unit 11 using the substrate carry-in substrate holder 18 of the substrate carry-in/out unit 10.

Figure 6B:
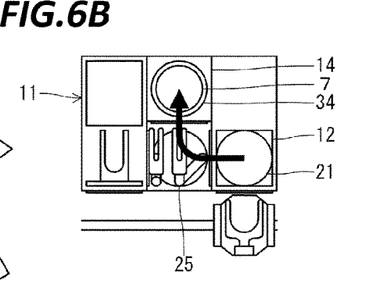

Thereafter, as illustrated in FIG. 6B, the substrate 7 in the dray state is conveyed from the substrate placing unit 12 to the liquid processing unit 14 using the substrate holder 28 of the dry substrate conveyance unit 25. The substrate 7 is subjected to a liquid processing with a processing liquid by the liquid processing device 34 of the liquid processing unit 14. The liquid processing unit 14 performs a cleaning processing on the substrate 7 by supplying a cleaning liquid from the cleaning processing nozzle 40 toward the surface of the substrate 7 in the state where the substrate 7 is rotated by the liquid processing device 34. Subsequently, the liquid processing unit 14 performs a rinse processing on the substrate 7 by supplying a rinse liquid from the rinse processing nozzle 41. Subsequently, when anti-drying liquid is supplied from the anti-drying processing nozzle 42 toward the surface of the substrate 7, and the surface of the substrate 7 is coated with the anti-drying liquid, the substrate 7 becomes a wet state.

Figure 6C:
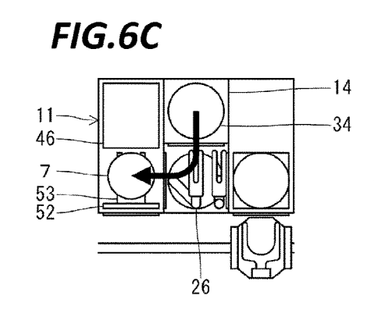

Thereafter, as illustrated in FIG. 6C, the substrate 7 in the wet state (the substrate 7 having the surface coated with the anti-drying liquid) is conveyed from the liquid processing unit 14 to the supercritical drying processing unit 15 using the substrate holder 30 of the wet substrate conveyance unit 26. The substrate 7 is subjected to a supercritical drying processing with a supercritical fluid by the supercritical drying processing device 46 of the supercritical drying processing unit 15. In the supercritical drying processing unit 15, the substrate 7 is accommodated inside the container body 47 by the substrate placing table 53 of the supercritical drying processing device 46 and the container body 47 is sealed with the cover 52. Subsequently, a fluid in a supercritical state is supplied from the processing fluid supply mechanism 50 to the inside of the container body 47, and the anti-drying liquid on the surface of the substrate 7 is replaced with the fluid in the supercritical state. Subsequently, the fluid in the supercritical state is discharged from the inside of the container body 47 by the discharge mechanism 51, so as to perform a pressure reduction inside the container body 47. Therefore, the substrate 7 is subjected to a supercritical drying processing and becomes a dry state. Subsequently, the substrate 7 is conveyed to the outside of the container body 47 by the substrate placing table 53.

Figure 6D:
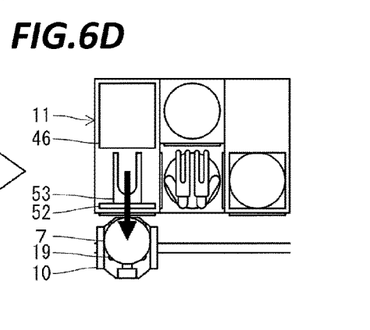

Thereafter, as illustrated in FIG. 6D, the substrate 7, which is in the dry state after the liquid processing and the supercritical drying processing, is carried from the supercritical drying processing unit 15 of the substrate processing unit 11 to the substrate delivery table 9 using the substrate carry-out substrate holder 19 of the substrate carry-in/out unit 10.

In the substrate processing apparatus 1, the substrate placing unit 12 and the dry substrate conveyance unit 25 are provided on the way of a path, along which the substrate 7 is conveyed from the substrate carry-in/out unit 10 to the liquid processing unit 14, and after the substrate 7 is carried from the substrate carry-in/out unit 10 into the substrate placing unit 12, the substrate 7 is conveyed from the substrate placing unit 12 to the liquid processing unit 14 using the dry substrate conveyance unit 25. Therefore, the substrate processing apparatus 1 may prevent the substrate carry-in/out unit 10 (more particularly, the substrate holder 18) from entering the liquid processing unit 14 (more particularly, the liquid processing device 34), and may prevent a processing liquid (more particularly, an organic solvent, such as, for example, isopropylalcohol having high volatility) in the liquid processing unit 14 from being attached to and contaminating the substrate carry-in/out unit 10 (the substrate holder 18). Therefore, it is possible to prevent the processing liquid from being transferred to the substrate 7, which has been subjected to a drying processing in the supercritical drying processing unit 15, and contaminating the substrate 7 via the substrate carry-in/out unit 10, and to increase the yield rate of the substrate processing apparatus 1.

Although the substrate processing apparatus 1 is configured as described above, the substrate processing apparatus according to the present invention is not limited to the above configuration, and may have a configuration to be described below. In addition, in the following description, the same elements as those of Example 1 are designated by the same reference numerals, and a description thereof will be omitted.

EXAMPLE 2

In the substrate processing apparatus 1 according to Example 1 described above, the substrate processing unit 11 includes one substrate placing unit 12, one substrate conveyance unit 13, one liquid processing unit 14, and one supercritical drying processing unit 15, but the present disclosure is not limited thereto. In a substrate processing apparatus 56 illustrated in FIG. 7, a substrate processing unit 57 may include a plurality of (here, two (2)) substrate conveyance units 13, liquid processing units 14, and supercritical drying processing units 15 with respect to one substrate placing unit 12. In addition, a plurality of placing tables 21 may be provided in one substrate placing unit 12 so as to store a plurality of substrates 7.

Figure 7:
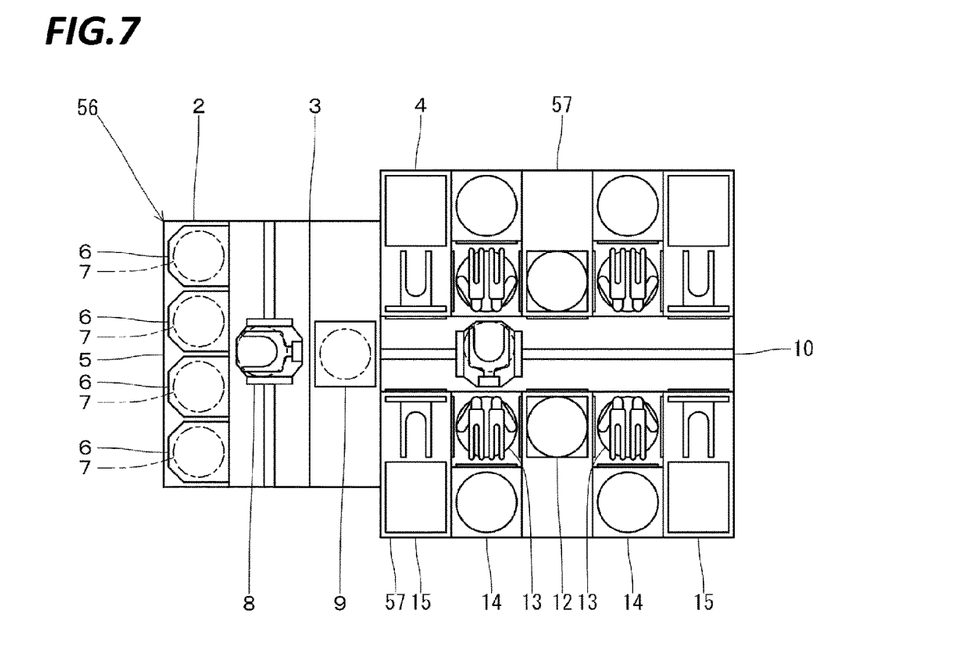
FIG. 7 is a plan explanatory view illustrating a substrate processing apparatus according to Example 2.

Accordingly, since one substrate placing unit 12 is shared by, for example, a plurality of liquid processing units 14, the size (footprint (occupation area)) of the substrate processing apparatus 56 may be further reduced, and correspondingly, the conveyance distance of the substrate 7 may be reduced, which may cause reduced processing time (increased throughput) in the substrate processing apparatus 56.

EXAMPLE 3

In the substrate processing apparatus 1 according to Example 1 described above, the substrate processing unit 11 is configured such that the substrate placing unit 12 is disposed at the same height as the substrate conveyance unit 13, the liquid processing unit 14, and the supercritical drying processing unit 15, but the present disclosure is not limited thereto. In a substrate processing apparatus 58 (a substrate processing unit 59) illustrated in FIG. 8, the substrate placing unit 12 may be disposed above the supercritical drying processing unit 15. In addition, the substrate placing unit 12 may be disposed below the supercritical drying processing unit 15, and may also be disposed above or below the liquid processing unit 14.

Figure 8:
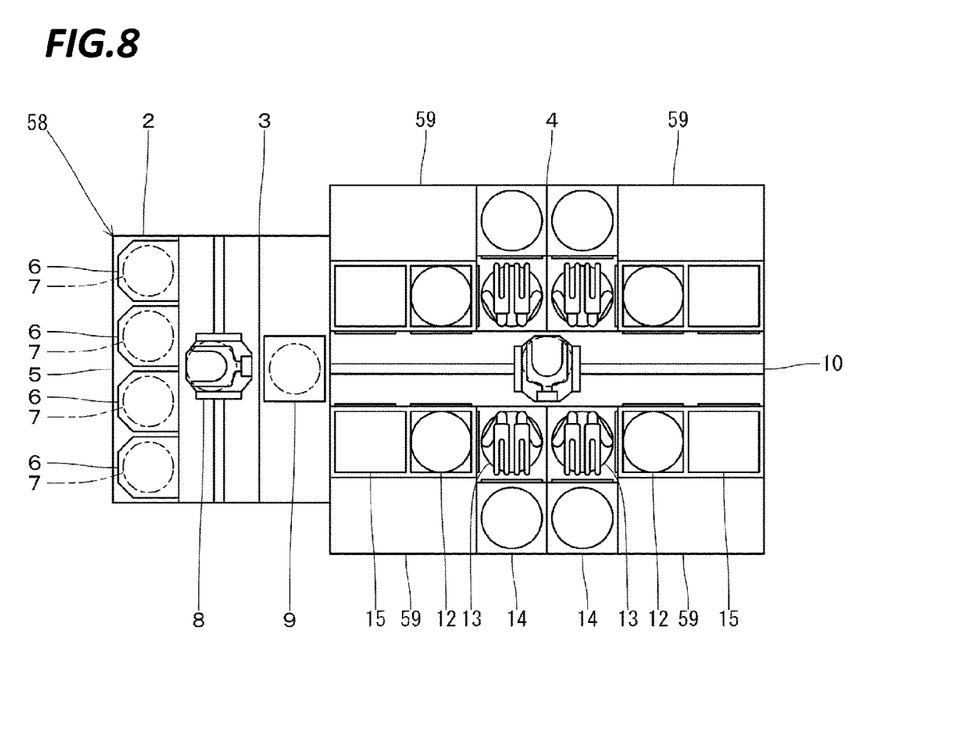
FIG. 8 is a plan explanatory view illustrating a substrate processing apparatus according to Example 3.

As such, even when the substrate placing unit 12 is disposed above or below the liquid processing unit 14 or the supercritical drying processing unit 15 so as to overlap each other (it is not limited to the case where they completely overlap each other, but includes the case where they partially overlap each other), the size (footprint (occupation area)) of the substrate processing apparatus 58 may be further reduced.

EXAMPLE 4

In the substrate processing apparatus 1 according to Example 1 described above, the substrate processing unit 11 includes one substrate placing unit 12, one substrate conveyance unit 13, one liquid processing unit 14, and one supercritical drying processing unit 15, but the present disclosure is not limited thereto. In a substrate processing apparatus 60 illustrated in FIG. 9, a substrate processing unit 61 may include a plurality of (here, two (2)) substrate placing units 12 and supercritical drying processing units 15 with respect to one substrate conveyance unit 13 and one liquid processing unit 14. In addition, here, although one liquid processing unit 14 and a plurality of supercritical drying processing units 15 are provided with respect to one substrate placing unit 13, a configuration in which one supercritical drying processing unit 15 and a plurality of liquid processing units 14 are provided with respect to one substrate conveyance unit 13, or a configuration in which a plurality of liquid processing units 14 and a plurality of supercritical drying processing units 15 are provided with respect to one substrate conveyance unit 13 may also be possible.

Figure 9:
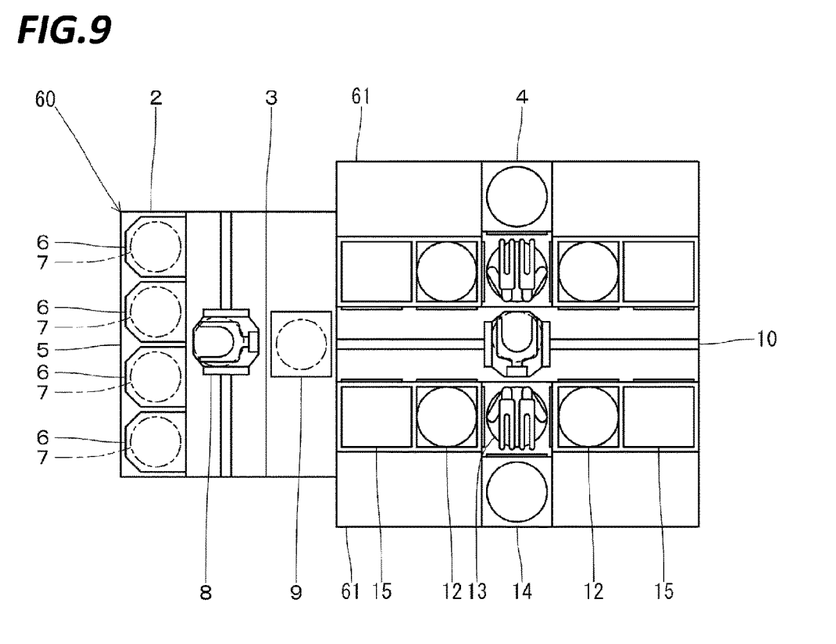
FIG. 9 is a plan explanatory view illustrating a substrate processing apparatus according to Example 4.

As such, even when the plurality of liquid processing units 14 or supercritical drying processing units 15 is provided with respect to one substrate conveyance unit 13, one substrate conveyance unit 13 may be shared by the liquid processing units 14 or the supercritical drying processing units Thus, the size (footprint (occupation area)) of the substrate processing apparatus 58 may be further reduced, and correspondingly, the conveyance distance of the substrate 7 may be reduced, which may cause reduced processing time (increased throughput) in the substrate processing apparatus 60. In addition, in the case where the liquid processing unit 14 and the supercritical drying processing unit 15 have a difference in processing time, one having a longer processing time (here, the supercritical drying processing unit 15) may be provided in a greater number than the other one (here, the liquid processing unit 14) because this may advantageously reduce the processing time in the entire substrate processing apparatus 60.

[Other Modifications]

In the substrate processing apparatuses 1, 56, 58 and 60 according to Examples 1 to 4, the conveyance section 3 is provided between the carry-in/out section 2 and the processing section 4, but the present disclosure is not limited thereto. As in a substrate processing apparatus 62 illustrated in FIG. 10 (Example 5) or a substrate processing apparatus 63 illustrated in FIG. 11 (Example 6), the conveyance section 3 may be removed, and the substrates 7 may be directly conveyed one by one from the carry-in/out section 2 to a substrate processing unit 64 or 65 by the substrate carry-in/out unit 10 of the processing section 4.

Figure 10:
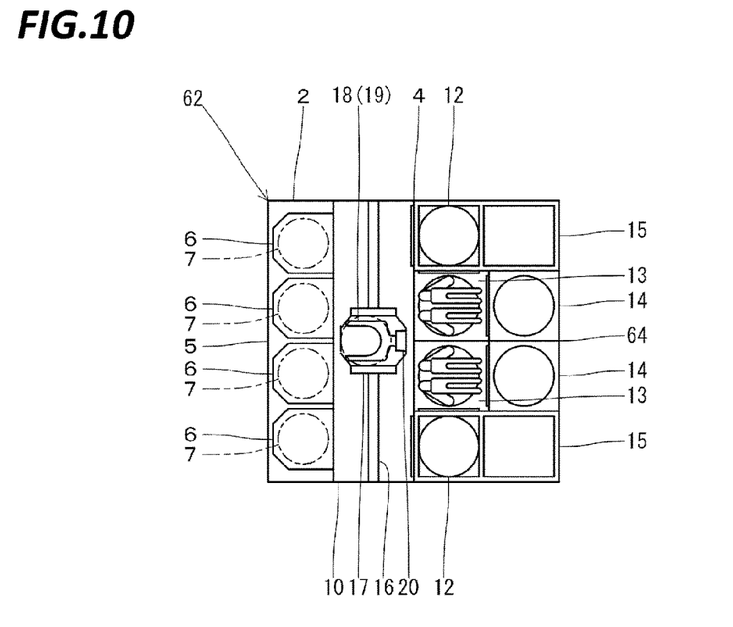
FIG. 10 is a plan explanatory view illustrating a substrate processing apparatus according to Example 5.
Figure 11:
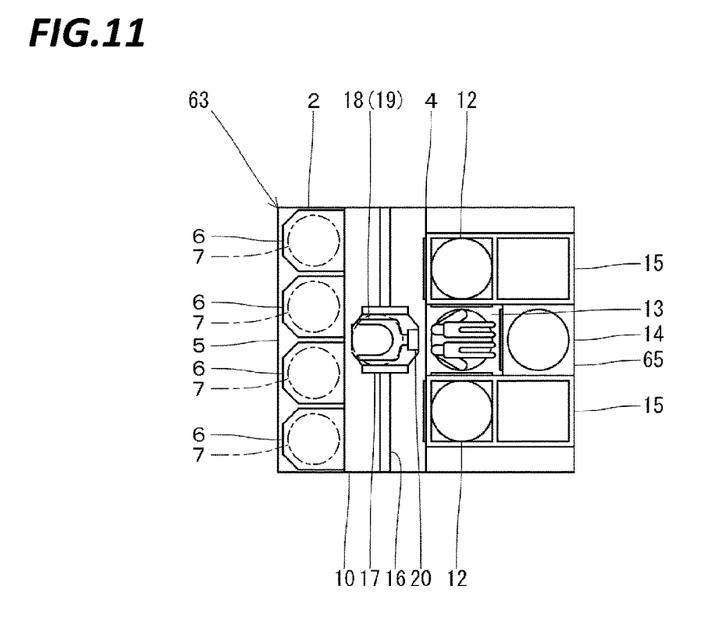
FIG. 11 is a plan explanatory view illustrating a substrate processing apparatus according to Example 6.

Accordingly, since the substrates 7 may be directly carried from the carrier 6 into the substrate placing unit 12 by the substrate carry-in/out unit 10 and the substrates 7 may be directly carried out from the supercritical drying processing unit 15 to the carrier 6, the size (footprint (occupation area)) of the substrate processing apparatuses 62 and 63 may be further reduced, and correspondingly, the conveyance distance of the substrate 7 may be reduced, which may cause reduced processing time (increased throughput) in the substrate processing apparatuses 62 and 63.

Figure 12:
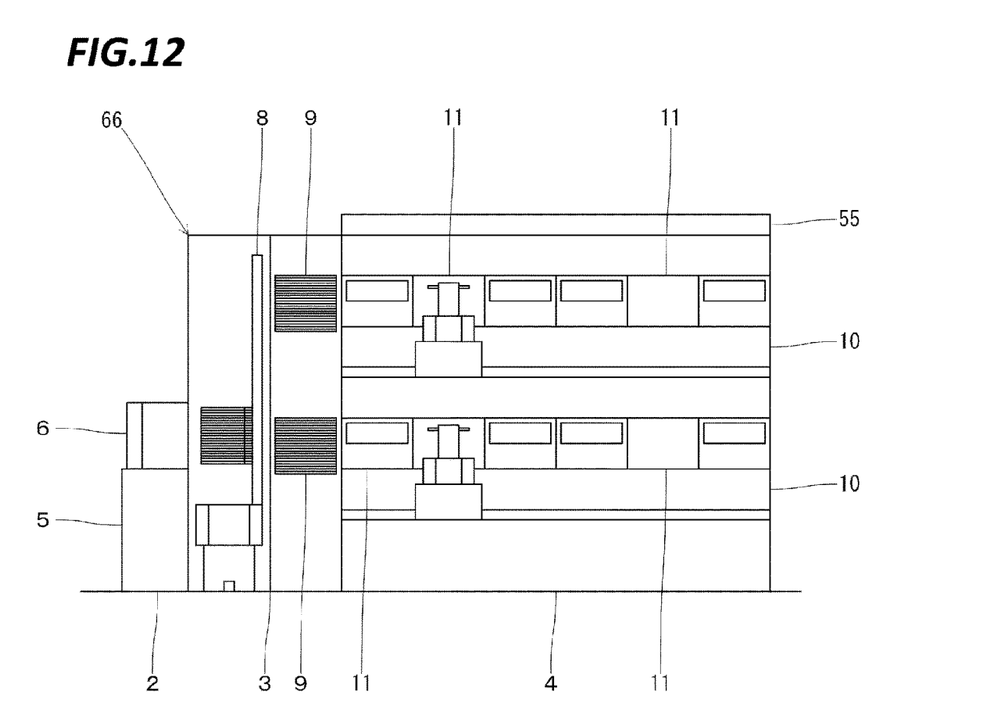
FIG. 12 is a cross-sectional side explanatory view illustrating a substrate processing apparatus according to Example 7.

In addition, in the substrate processing apparatuses 1, 56, 58, 60, 62, and 63 according to Examples 1 to 6, for example, a plurality of substrate carry-in/out units 10 and substrate processing units 11 (57, 59, 61, 64, or 65) may be vertically arranged side by side, so as to increase the processing ability (the number of substrates processed per hour) of the substrate 7, as in a substrate processing apparatus 66 illustrated in FIG. 12 (Example 7).

In the substrate processing apparatuses 1, 56, 58, 60, 62, and 63 according to Examples 1 to 6, the substrate 7 is subjected to a drying processing using a supercritical fluid, but the present disclosure is not limited thereto. The substrate 7 may be dried using a supercritical fluid or other fluids, or other drying devices.

In the substrate processing apparatuses 1, 56, 58, 60, 62, and 63 according to Examples 1 to 6, the substrate 7 is carried into the substrate placing unit 12 by the substrate carry-in/out unit 10, but the present disclosure is not limited thereto. The substrate placing unit 12 may not be provided, and the substrate 7 may be directly carried into the dry substrate conveyance unit 25 of the substrate conveyance unit 13. Therefore, the size of the substrate processing apparatus 1 may be further reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a liquid processing chamber configured to perform a liquid processing on a substrate using a processing liquid;
   a drying processing chamber provided at a side of the liquid processing chamber and configured to perform a drying processing on the substrate in a wet state after the liquid processing in the liquid processing chamber;
   a placing table provided at a diagonal position of the liquid processing chamber;
   a first conveyance arm including a first holder and provided in front of the liquid processing chamber and at a side of the placing table to face both the liquid processing chamber and the placing table when viewed from above, the first conveyance arm being configured to convey the substrate before the liquid processing to the liquid processing chamber from the placing table using the first holder thereof; and
   a second conveyance arm including a second holder and provided between the first conveyance arm and the drying processing chamber to face the drying processing chamber and the liquid processing chamber, respectively, the second conveyance arm being configured to convey the substrate in the wet state from the liquid processing chamber to the drying processing chamber using the second holder thereof,
   wherein the substrate before the liquid processing is conveyed in a dry state to the placing table by a third holder of a conveyance table, which is movable on a rail extended along a side of each of the placing table, the first conveyance arm, the second conveyance arm and the drying processing chamber, and the substrate after the drying processing is removed in a dry state from the drying processing chamber by a fourth holder of the conveyance table, and
   the first conveyance arm and the second conveyance arm are provided between the liquid processing chamber and the rail, and a cover is provided at a carry-out port from the drying processing chamber.

2. The substrate processing apparatus of claim 1, wherein the conveyance table performs conveyance of the substrate to and from a carrier that accommodates a plurality of substrates therein.

3. The substrate processing apparatus of claim 1, wherein the drying processing chamber includes a container body, a substrate placing table accommodated inside the container body, and the cover is attached to the substrate placing table and configured to cover or open a front opening of the container body, and
   the cover is movable together with the substrate placing table between a processing position at which the substrate placing table is accommodated inside the container body and the cover attached to the substrate placing table covers the front opening of the container body, and a standby position at which the cover and the substrate placing table are retreated to an outside of the container body such that the front opening of the container body is opened, and
   the substrate is placed on the substrate placing table positioned at the standby position by the second holder of the second conveyance arm, and is removed from the substrate placing table positioned at the standby position by the fourth holder of the conveyance table.

4. The substrate processing apparatus of claim 1, wherein the drying processing chamber performs a drying processing on the substrate in the wet state using a supercritical fluid.

* * * * *